United States Patent [19]

Bjorklund et al.

[11] 4,431,259
[45] Feb. 14, 1984

[54] HOLOGRAPHIC RECORDING MEDIA FOR INFRARED LIGHT

[75] Inventors: Gary C. Bjorklund, Los Altos, Calif.; Christoph R. Brauchle, Munich, Fed. Rep. of Germany; Donald M. Burland, Los Gatos; Heinrich E. Hunziker, Saratoga, both of Calif.; Urs P. Wild, Zurich, Switzerland

[73] Assignee: International Business Machines Corporation, Armonk, N.Y.

[21] Appl. No.: 316,156

[22] Filed: Oct. 28, 1981

[51] Int. Cl.$^3$ ............................................. G03H 1/04
[52] U.S. Cl. ..................... 350/361; 350/1.1; 430/1
[58] Field of Search ................ 350/3.61, 3.62; 430/1, 430/2; 350/1.1

[56] References Cited

U.S. PATENT DOCUMENTS

| | | | |
|---|---|---|---|
| 3,926,637 | 12/1975 | Bartolini et al. | 350/3.61 |
| 3,951,663 | 4/1976 | Ross | 350/3.61 |
| 4,022,618 | 5/1977 | Bartolini et al. | 350/3.61 |
| 4,049,459 | 9/1977 | Bloom et al. | 430/2 |

OTHER PUBLICATIONS

"Photodielectric Polymer for Holographic Recording" by A. A. Friesem et al., Appl. Opt. 16, 427 (1977).
"Organic Recording Medium for Volume-Phase Holography" by Allen Bloom et al., Appl. Phys. Lett. 24, 612 (1974).
"Hologram Recording by Visible Diode Lasers" by K. Tatsuno et al., Appl. Opt. 29, 2096 (1980).

Primary Examiner—Bruce Y. Arnold
Attorney, Agent, or Firm—Joseph G. Walsh

[57] ABSTRACT

A gated self-developing, non-bleachable holographic material is disclosed which is useful in the infrared region. The holographic material comprises a polymeric matrix with an α-diketone compound uniformly dispersed therein.

5 Claims, No Drawings

HOLOGRAPHIC RECORDING MEDIA FOR INFRARED LIGHT

DESCRIPTION

1. Technical Field

The present invention is concerned with recording media useful in making holograms. In particular, the invention is concerned with such media that are useful with recording light in the infrared region of the spectrum.

2. Background Art

There are only a few types of holographic materials that have a wavelength response beyond 750 nm. Most of the materials known heretofore have low spatial resolution. Therefore, high quality holographic optical elements have not been possible for use with important longer wavelength lasers such as GaAlAs (800–850 nM), Nd:YAG or Nb:glass (1.06 $\mu$m) or GaInAsP (1.2–1.6 $\mu$m) lasers. The use of prior art organic holographic recording materials for single photon holography at wavelengths shorter than 750 nm is shown in publications such as A. A. Friesen et al, Appl. Opt. 16, 427 (1977) and A. Bloom et al, Appl. Phys. Lett. 24, 612 (1974). Single photon holography at wavelengths as long as 748 nm using conventional silver halide film is shown in the publication K. Tatsuno et al, Appl. Opt. 19, 2096 (1980).

Four-level two-photon holography has previously been described in U.S. patent application Ser. No. 06/208,740, filed Nov. 20, 1980, now U.S. Pat. No. 4,339,513. Neither that application, however, nor any other prior art of which we are aware makes any mention of the $\alpha$-diketone materials described in the present invention for use in two-photon holography.

Disclosure of the Invention

According to the present invention, self-developing non-bleachable holographic media are obtained for use with light of the wavelength 600–1100 nm using a polymeric matrix transparent within said wavelength, and uniformly dispersed within said matrix, an $\alpha$-diketone which is non-reactive with the matrix.

When a recording medium is made according to the present invention, it is possible to obtain holograms using light in the infrared region. Furthermore, these holograms are self-developing and non-bleachable. The recording process can be gated off and on using an auxiliary lamp or laser producing radiation in a spectral region significantly removed from the wavelength of the writing laser. Holograms produced according to the present invention have efficiencies of greater than 10% at 752 nm.

For use in the present invention it is necessary that the polymeric material by transparent to light within the range of 600–1100 nm. Many such polymeric materials are known. Particularly useful are polymethylmethacrylate and the most preferred materials of all, the polycyanoacrylates, such as $\alpha$-methyl, $\alpha$-ethyl or $\alpha$-isobutyl cyanoacrylate.

According to the present invention, there is uniformly dispersed within the host polymer an $\alpha$-diketone. (The expression $\alpha$-diketone is used in its ordinary sense, that is, a compound having a ketone group on each of two carbon atoms connected by a single bond.) Among the useful $\alpha$-diketones, there may be mentioned camphorquinone, benzil and the most preferred material, biacetyl. The $\alpha$-diketone should not react chemically with the matrix material, but it should be capable of being uniformly dispersed throughout the polymeric matrix.

The holographic recording process is gated on or off by light from either a lamp or laser in the wavelength range shorter than 450 nm. This light excites the lowest singlest state. The actual recording is done by two interfering beams that result in a triplet-triplet absorption and ultimately irreversible photochemistry. These interfering beams are in the frequency range 600–1100 nm.

The initial concentration of the $\alpha$-diketone in the polymeric matrix should be in the concentration range of about 0.5 to about 30% by weight. In general, it is most preferred that the concentration be in the range 10–20% by weight. The precise optimum concentration depends upon the thickness of the holographic material and the wavelengths used to produce the hologram.

Holographic recording with 752 nm laser radiation has been demonstrated being camphorquinone, benzil and biacetyl contained in a cyanoacrylate host. Holographic recording with 752 nm laser light has been demonstrated using biacetyl contained in cyanoacrylate, methyl cyanoacrylate, ethyl cyanoacrylate, isobutyl cyanoacrylate and polymethylacrylate hosts. In addition, holographic recording with 1064 nm laser radiation has been demonstrated using biacetyl contained in a cyanoacrylate host. A hologram diffraction efficiency of 20% was obtained using 752 nm laser radiation and a sample consisting of 20% by weight biacetyl in cyanoacrylate that was 800 $\mu$m thick.

We claim:

1. A recording process for gated self-developing non-bleachable holography comprising the steps of:
   (1) gating with light of wavelength shorter than 450 nm a recording medium comprising a polymeric material which is transparent within said wavelength and which has uniformly dispersed within said polymeric material, an $\alpha$-diketone nonreactive with the polymeric material,
   (2) recording in said recording medium with two interfering beams having wavelengths in the wavelength range from 600–1100 nm, and
   (3) causing a triplet-triplet absorption and an irreversible photochemistry reaction in said medium.

2. A recording process as claimed in claim 1 wherein the $\alpha$-diketone is biacetyl.

3. A recording process as claimed in claim 1 wherein the $\alpha$-diketone is camphorquinone.

4. A recording process as claimed in claim 1 wherein the $\alpha$-diketone is benzil.

5. A recording process as claimed in claim 1 wherein the polymeric material is a polycyanoacrylate.

* * * * *

UNITED STATES PATENT AND TRADEMARK OFFICE
CERTIFICATE OF CORRECTION

PATENT NO. : 4,431,259
DATED : February 14, 1984
INVENTOR(S) : Gary C. Bjorklund, Christoph R. Brauchle, Donald M. Burland, Heinrich E. Hunziker and Urs P. Wild It is certified that error appears in the above—identified patent and that said Letters Patent is hereby corrected as shown below:

Col. 2, line 27, the word "being" should be --using--.

Signed and Sealed this

Seventh Day of August 1984

[SEAL]

Attest:

GERALD J. MOSSINGHOFF

Attesting Officer

Commissioner of Patents and Trademarks